(12) United States Patent
Subrahmanyam

(10) Patent No.: US 7,539,603 B2
(45) Date of Patent: May 26, 2009

(54) DETECTION OF COMPONENT HOLE GAPS FOR WELD BEADS IN A COMPUTER-IMPLEMENTED SOLID MODELING SYSTEM

(75) Inventor: Somashekar Ramachandran Subrahmanyam, Farmington Hills, MI (US)

(73) Assignee: Autodesk, Inc., San Rafael, CA (US)

( * ) Notice: Subject to any disclaimer, the term of this patent is extended or adjusted under 35 U.S.C. 154(b) by 591 days.

(21) Appl. No.: 11/215,424

(22) Filed: Aug. 30, 2005

(65) Prior Publication Data

US 2007/0050067 A1     Mar. 1, 2007

(51) Int. Cl.
    *G06F 9/455* (2006.01)
(52) U.S. Cl. .................. 703/6; 219/121.63; 219/125.1; 700/212
(58) Field of Classification Search ............... 703/6, 703/2; 700/212; 219/212.64, 124.34, 130.21; 705/22; 414/687; 228/173.1
See application file for complete search history.

(56) References Cited

U.S. PATENT DOCUMENTS

| | | | |
|---|---|---|---|
| 6,362,456 B1 * | 3/2002 | Ludewig et al. | 219/124.34 |
| 2004/0169062 A1 * | 9/2004 | Maruyama et al. | 228/173.1 |
| 2005/0049742 A1 | 3/2005 | Subrahmanyam | |
| 2005/0071042 A1 * | 3/2005 | Subrahmanyam et al. | 700/212 |
| 2005/0121426 A1 * | 6/2005 | Wang et al. | 219/121.64 |
| 2006/0251503 A1 * | 11/2006 | Janes et al. | 414/687 |
| 2007/0043622 A1 * | 2/2007 | Olsen et al. | 705/22 |
| 2007/0181548 A1 * | 8/2007 | Kaddani et al. | 219/130.21 |

* cited by examiner

*Primary Examiner*—Paul L Rodriguez
*Assistant Examiner*—Kandasamy Thangavelu

(57) ABSTRACT

A computer-implemented solid modeling system that determines whether a gap exists between components based on internal loops of the components, and then generates a fillet or groove weld bead that fills the gap between the components. The gap is a component hole gap between components where one or more internal loops of a first component fully or partially encircles a second component, and the valid internal loops identify whether the second component passes through the first component through the component hole gap.

26 Claims, 13 Drawing Sheets

700

700

DETECTION OF COMPONENT HOLE GAPS FOR WELD BEADS IN A COMPUTER-IMPLEMENTED SOLID MODELING SYSTEM

CROSS-REFERENCE TO RELATED APPLICATIONS

This application is related to the following and commonly-assigned U.S. Utility patent application Ser. No. 10/651,452, filed Aug. 29, 2003, by Somashekar R. Subrahmanyam, entitled "Facial characteristic based generation of fillet weld bead representation," which application was published as U.S. Patent Application Publication 2005/0049742A1, on Mar. 3, 2005, and which application is incorporated by reference herein.

BACKGROUND OF THE INVENTION

1. Field of the Invention

The present invention relates generally to computer-assisted design (CAD) systems, and in particular, to detection of component hole gaps for weld beads in a computer-implemented solid modeling system.

2. Description of the Related Art

Over the last decade, designers have changed their fundamental approach to graphics design, moving from two-dimensional (2D) drawing systems to three-dimensional (3D) solid modeling systems. New software makes solid modeling technology available and affordable to virtually anyone.

Solid modeling is a technique that allows designers to create dimensionally accurate 3D solid models in 3D space represented within a computer, rather than traditional 2D drawings. 3D solid models include significantly more engineering data than 2D drawings, including the volume, bounding surfaces, and edges of a design.

With the graphics capabilities of today's computers, these 3D solid models may be viewed and manipulated on a monitor. In addition to providing better visualization, 3D solid models may be used to automatically produce 2D drawing views, and can be shared with manufacturing applications and the like.

Some 3D solid modeling systems generate parametric feature-based models. A parametric feature-based model is comprised of intelligent features, such as holes, fillets, chamfers, etc. The geometry of the parametric feature-based model is defined by underlying mathematical relationships (i.e., parameters) rather than by simple unrelated dimensions, which makes them easier to modify. These systems preserve design intent and manage it after every change to the model.

Moreover, these features automatically change as the model is changed. The system computes any related changes to parts of the model that are dependent on a parameter, and automatically updates the entire model when the parameter is changed. For example, a through-hole will always completely go through a specified part, even if the part's dimensions are changed to be bigger than the hole.

Two parametric features found in solid modeling systems are fillet and groove welds, which are the most commonly used type of 3D solid weld beads for joining materials in the welding industry. The representation of a weld in the computer is known as a weld bead.

A weld bead is a parametric representation of the real weld. Typically, the weld bead runs along two or more components, and is represented by a 3D solid, which is closed, connected and regular. The weld bead is a separate entity and is not merged with the components that it references. Moreover, it is only an approximate representation of the real weld.

There are a number of geometrically complex cases that may use weld beads. As a result, it would be helpful if the solid modeling system could determine whether any gaps exist between the components being welded. Specifically, the detection of such gaps could be used to determine the algorithm to generate the weld bead for a given weld feature type.

Consequently, there is a need in the art for a solid modeling system that more efficiently and effectively generates weld beads. The present invention satisfies that need.

SUMMARY OF THE INVENTION

To overcome the limitation in the prior art described above, and to overcome other limitations that will become apparent upon reading and understanding the present specification, the present invention describes a computer-implemented solid modeling system that that determines whether a gap exists between components based on internal loops of the components, and then generates a fillet or groove weld bead that fills the gap between the components. The gap is a component hole gap between components where one or more internal loops of a first component fully or partially encircles a second component, and the valid internal loops identify whether the second component passes through the first component through the component hole gap.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, an embodiment of the present invention. It is understood that other embodiments may be utilized and structural changes may be made without departing from the scope of the present invention.

Overview

The present invention is a computer-implemented, parametric, feature-based, solid modeling system that detects component hole gaps for weld beads and then uses an appropriate method to generate the shape of the weld beads.

Hardware and Software Environment

Figure 1:
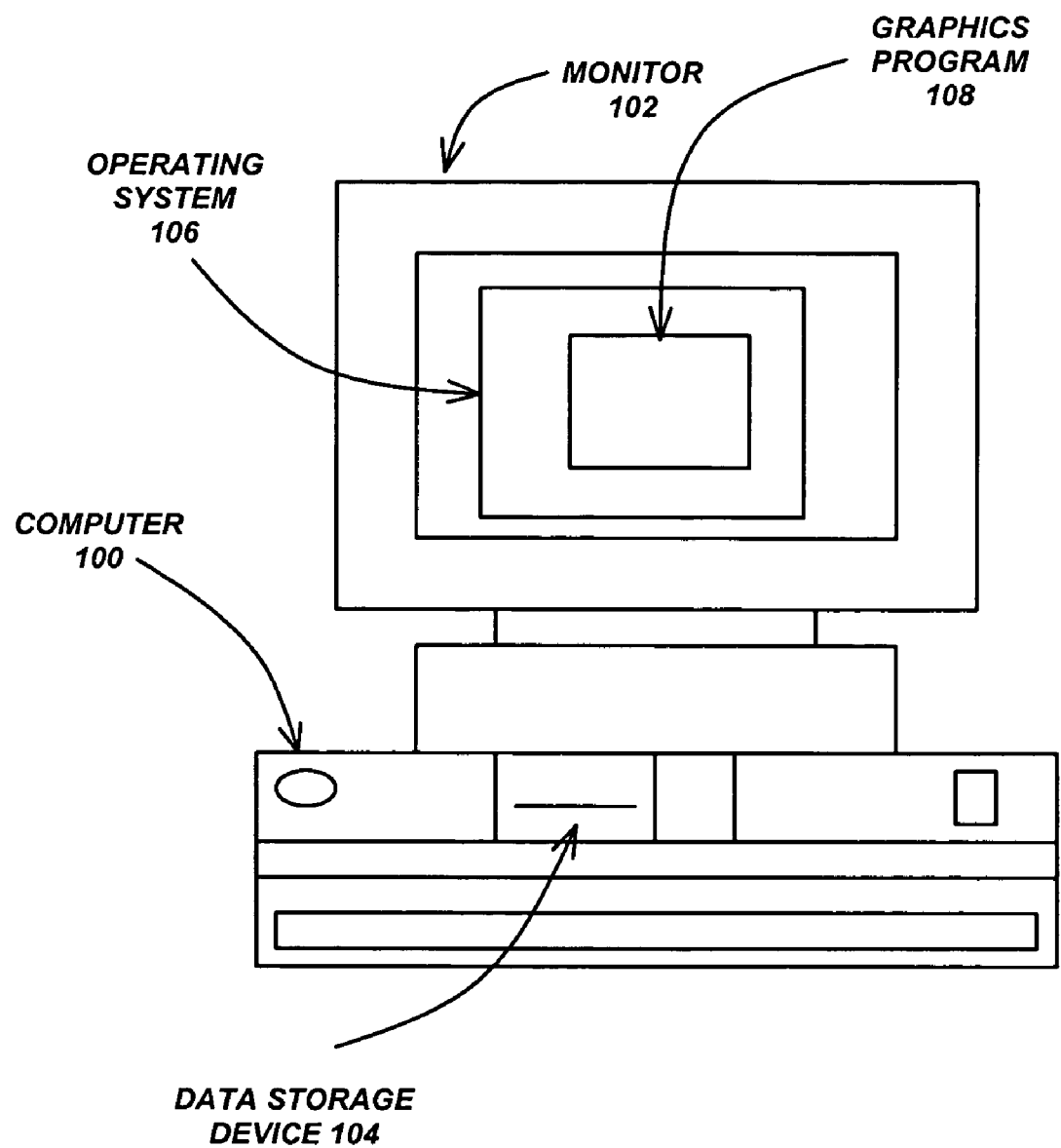
FIG. 1 is an exemplary hardware and software environment used to implement the preferred embodiment of the invention.

FIG. 1 is an exemplary hardware and software environment used to implement the preferred embodiment of the invention. The preferred embodiment of the present invention is typically implemented using a computer 100, which generally includes, inter alia, a monitor 102, data storage devices 104, and other devices. Those skilled in the art will recognize that any combination of the above components, or any number of different components, peripherals, and other devices, may be used with the computer 100.

The computer 100 usually operates under the control of an operating system 106, which is represented by a window displayed on the monitor 102. The preferred embodiment of the present invention is implemented by a computer-implemented graphics program 108 that operates under the control of the operating system 106, wherein the graphics program 108 is also represented by a window displayed on the monitor 102.

Generally, the operating system 106 and graphics program 108 comprise logic and/or data embodied in or readable from a device, media, or carrier, e.g., one or more fixed and/or removable data storage devices 104 connected directly or indirectly to the computer 100, one or more remote devices coupled to the computer 100 via data communications devices, etc.

Those skilled in the art will recognize that the exemplary environment illustrated in FIG. 1 is not intended to limit the present invention. Indeed, those skilled in the art will recognize that other alternative environments may be used without departing from the scope of the present invention.

Computer-Implemented Graphics Program

Figure 2:
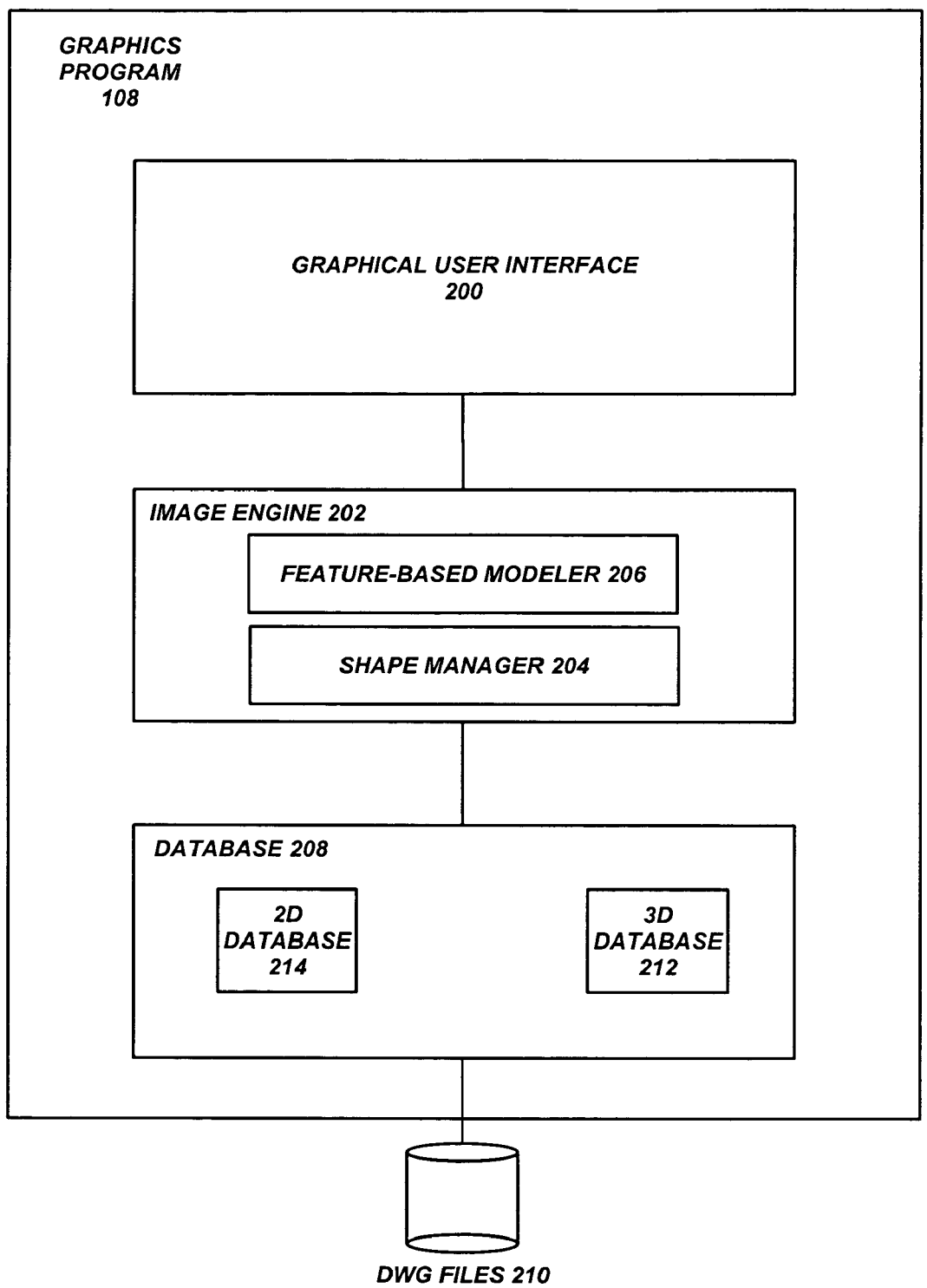
FIG. 2 is a block diagram that illustrates the components of the graphics program according to the preferred embodiment of the present invention.

FIG. 2 is a block diagram that illustrates the components of the graphics program 108 according to the preferred embodiment of the present invention. There are three main components to the graphics program 108, including: a Graphical User Interface (GUI) 200, an Image Engine (IME) 202 including a Shape Manager (SM) 204 and Feature-Based Modeler (FM) 206, and a database (DB) 208 for storing objects in Drawing (DWG) files 210.

The Graphical User Interface 200 displays information to the user and provides the functionality for the user's interaction with the graphics program 108.

The Image Engine 202 processes the Database 208 or DWG files 210 and delivers the resulting graphics to an output device. In the preferred embodiment, the Image Engine 202 provides a complete application programming interface (API) that allows other computer programs to interface to the graphics program 108 as needed.

The Shape Manager 204 (also known as a Geometric Modeler) primarily creates geometry and topology for models. The Feature-Based Modeler 206, which interacts with the Shape Manager 204, is a parametric feature-based solid modeler that integrates 2D and 3D mechanical design tools, including parametric assembly modeling, surface modeling, 2D design, and associative drafting. The Feature-Based Modeler 206 provides powerful solid-, surface-, and assembly-modeling functionality.

The Database 208 is comprised of two separate types of databases: (1) a 3D database 212 known as the "world space" that stores 3D information; and (2) one or more 2D databases 214 known as the "virtual spaces" or "view ports" that stores 2D information derived from the 3D information. The 3D database 212 captures the design intent and behavior of a component in a model.

Object Structure

Figure 3:
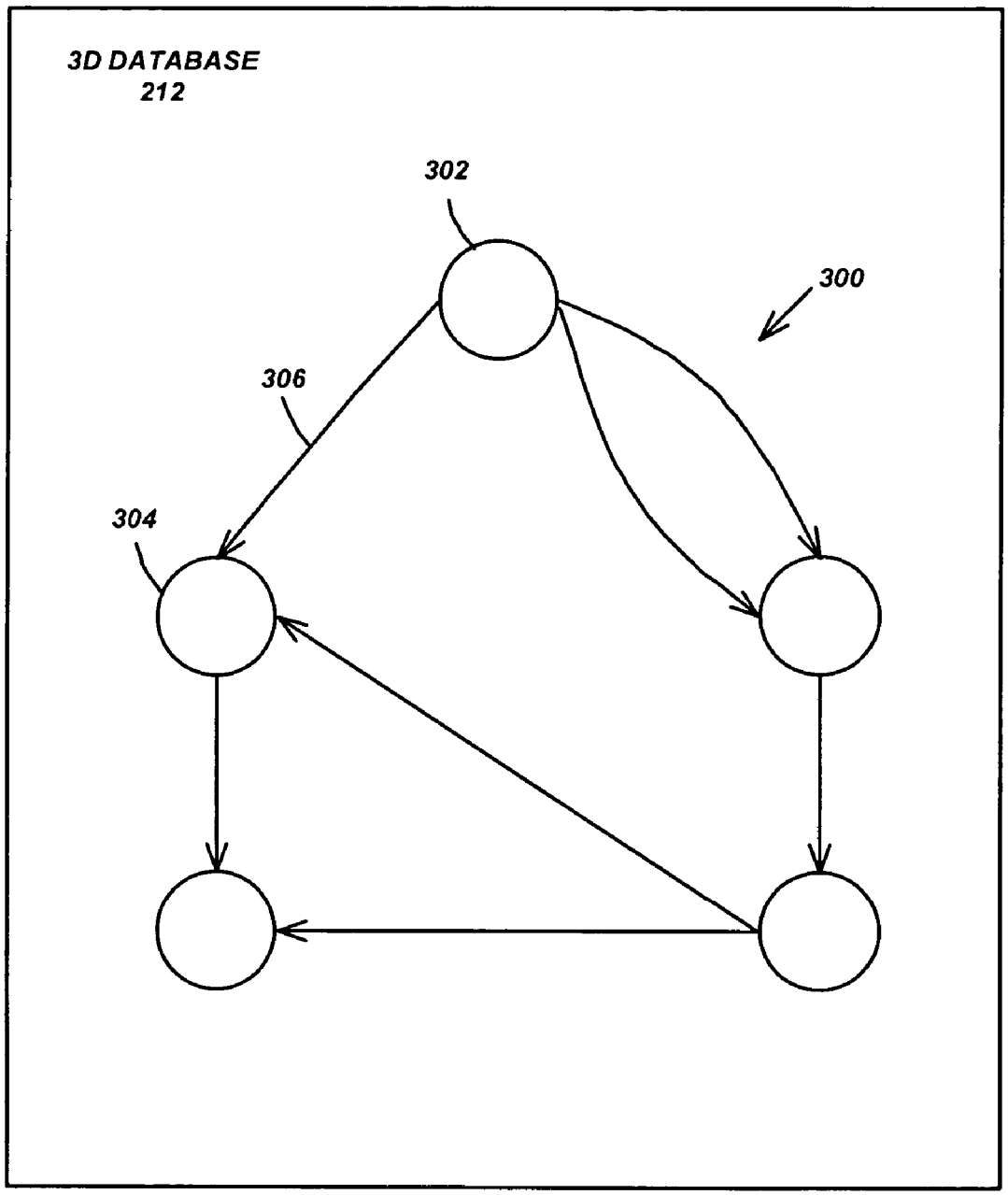
FIG. 3 is a block diagram that illustrates an object structure maintained in a database according to the preferred embodiment of the present invention.

FIG. 3 is a block diagram that illustrates an object structure 300 maintained by the 3D database 212 according to the preferred embodiment of the present invention. Each object structure 300 includes a header node 302 and usually includes one or more nodes 304 connected by zero or more edges 306. There may be any number of different object structures 300 maintained by the 3D database 212. Moreover, a node 304 may be a member of multiple structures 300 in the 3D database 212.

Operation of the Preferred Embodiment

In the operation of the preferred embodiment of the present invention, given a multi-component (C1, ..., Cn) assembly represented in the object structure 300, the Feature-Based Modeler 206 determines whether there is a gap between the components. If so, the Feature-Based Modeler 206 generates either a fillet or groove weld bead that fills the gap between the components.

In the preferred embodiment of the present invention, the Feature-Based Modeler 206 detects the gap between components based on internal loops in the components. Specifically, the Feature-Based Modeler 206 detects whether the component hole gap is made up of valid explicit internal loops or valid implicit internal loops. The detection of these valid explicit and implicit internal loops assists in identifying a specific geometric configuration of the components in an assembly, i.e., whether a first component passes through a second component through a component hole gap. Thereafter, the Feature-Based Modeler 206 uses the internal loops to close the component hole gap by creating the weld bead.

Fillet weld bead are created using the techniques described in the co-pending and commonly-assigned U.S. Utility patent application Ser. No. 10/651,452, filed Aug. 29, 2003, by Somashekar R. Subrahmanyam, entitled "Facial characteristic based generation of fillet weld bead representation," which application was published as U.S. Patent Application Publication 2005/0049742A1, on Mar. 3, 2005, and which application is incorporated by reference herein. Groove weld beads are created using other techniques (Thicken vs. Sweep, or other suitable technique).

In fillet welds, the present invention uses a different technique for a component hole gap, i.e., the gap case is converted into a non-gap case by filling the gap and, then the fillet weld bead shape is generated using the methods described in the co-pending and commonly-assigned U.S. Utility patent application Ser. No. 10/651,452, filed Aug. 29, 2003, by Somashekar R. Subrahmanyam, entitled "Facial characteristic based generation of fillet weld bead representation," which application was published as U.S. Patent Application Publication 2005/0049742A1, on Mar. 3, 2005, and which application is incorporated by reference herein.

For groove weld beads, if a component hole gap is detected, the Shape Manager 204 uses the Thicken method, versus the Sweep method or some other suitable method. The detection of the component hole gap aids in telling the Shape Manager 204 what method to use to generate the groove weld bead shape.

The following inputs are provided in the operation of the preferred embodiment of the present invention:

Type of weld feature: Fillet or Groove.

Two face collection sets (known as face-sets) originating from the components.

For fillet welds only, a first leg length (L1) associated with a first face-set (FS1) and a second leg length (L2) associated with a second face-set (FS2). These leg lengths specify the height of the weld in two mutually perpendicular directions.

For groove welds only, whether each face-set is Full or Partial, i.e., whether they cover the weld with the entire face or just part of the face, and a direction (for full-full, the direction is calculated internally) to fill the weld.

In addition, the following assumptions are made in the operation of the preferred embodiment of the present invention:

A single component could also be specified where both face-sets FS1 and FS2 originate from the same component.

All the faces in a face-set must be unique, i.e., a face cannot belong to more than one face-set.

The components could intersect.

L1 and L2 could be unequal but should have finite non-zero values for fillet welds.

The weld bead is a separate entity that does not interfere with the two components.

Attributes assigned to the components specify split and merge behaviors. Attribute propagation and management is performed by the Shape Manager 204.

The following examples in FIGS. 4A-C, 5A-D, 6A-F, 7A-B, 8A-D and 9A-B illustrate the operation of the preferred embodiment of the present invention. These examples also refer to the logic of FIG. 10 (for detection of component hole gaps), FIG. 11 (for detection of valid explicit internal loops) and FIGS. 12A-B (for detection of valid implicit internal loops) below.

Figure 4A:
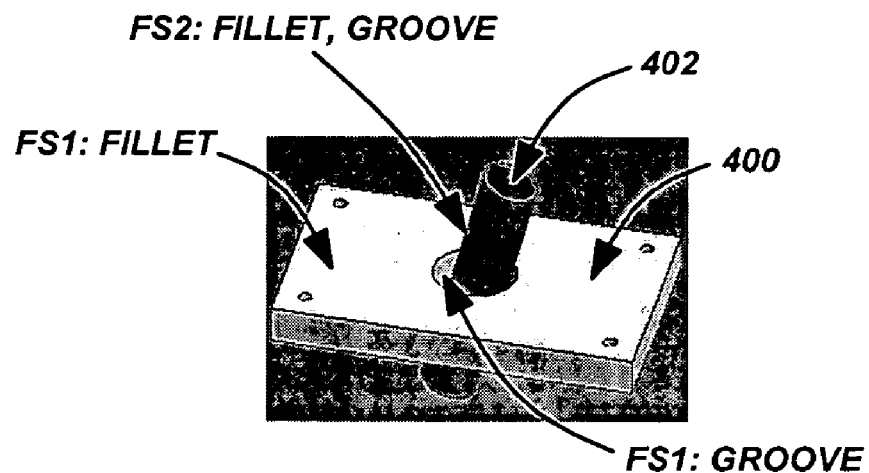
FIGS. 4A-C, 5A-D, 6A-F, 7A-B, 8A-D and 9A-B are examples that illustrate the operation of the preferred embodiment of the present invention.
Figure 4B:
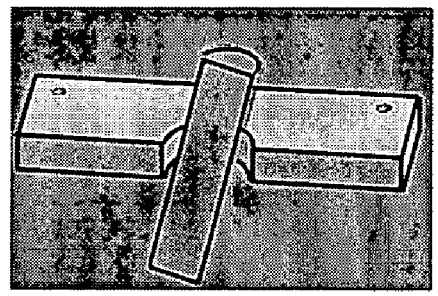
Figure 4C:
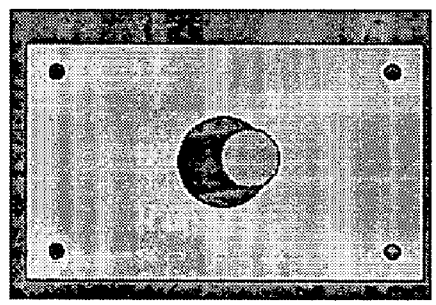

FIG. 4A shows an example where a first component 400 is welded to a second component 402, wherein FIG. 4B shows a half-section view of FIG. 4A and FIG. 4C shows a top view of FIG. 4A. For a fillet weld bead, the first face-set, FS1, would comprise the top planar face of component 400, and the second face-set, FS2, would comprise the cylindrical face of component 402. For a groove weld bead, the first face-set, FS1, would comprise the face of the aperture in component 400 through which component 402 passes, and the second face-set, FS2, would comprise the cylindrical face of component 402.

Figure 5A:
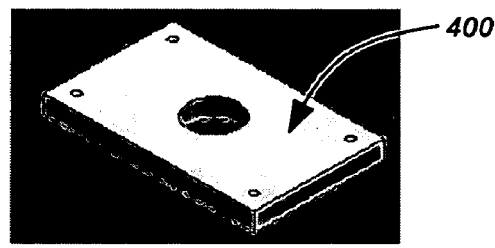
Figure 5B:
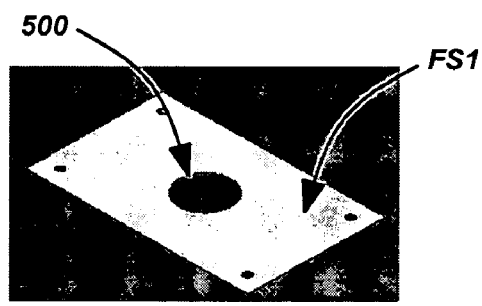
Figure 5C:
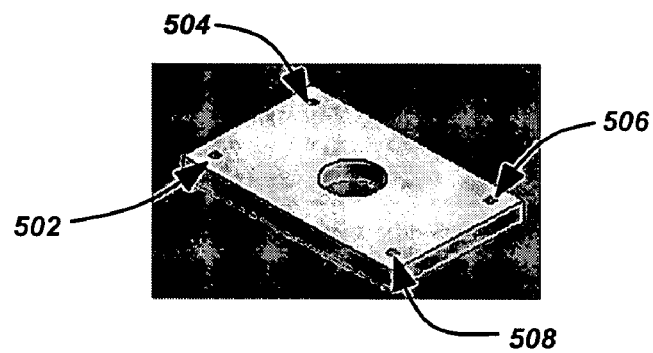
Figure 5D:
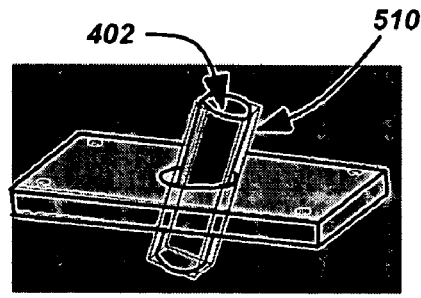

FIG. 5A shows another example of component 400. At first, the present invention extracts the weldable faces FS1 from component 400, as shown in FIG. 5B, for fillet welds. Using the logic for detection of valid explicit internal loops (as described in FIG. 11 below), there are five internal loops shown in FIG. 5B (500) and FIG. 5C (502, 504, 506, 508). FIG. 5D shows the bounding box 510 of 402.

The loop 500 in FIG. 5B is classified as a valid explicit internal loop because a bounding box of that loop 500 would intersect the bounding box 510 of 402. The four loops (502, 504, 506, 508) in FIG. 5C are classified as invalid explicit internal loops because bounding boxes for those four loops (502, 504, 506, 508) would not intersect with the bounding box 510 of 402.

Figure 6A:
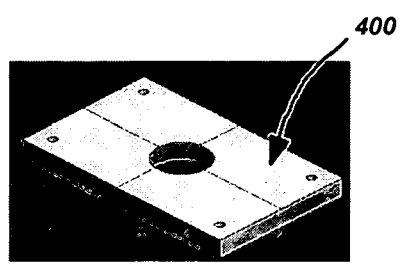
Figure 6B:
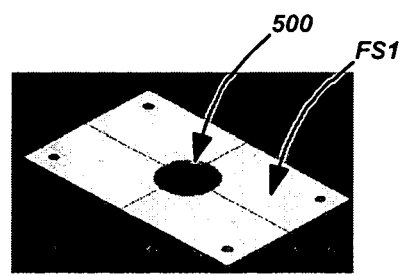
Figure 6C:
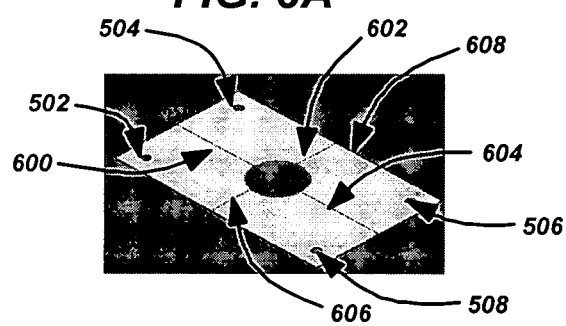
Figure 6D:
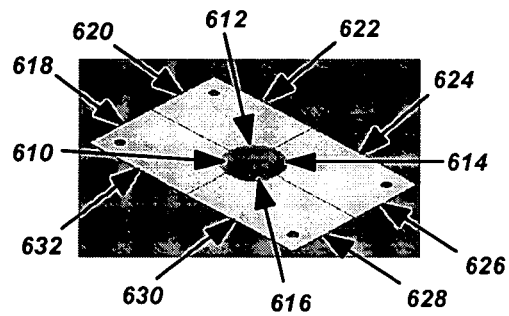
Figure 6E:
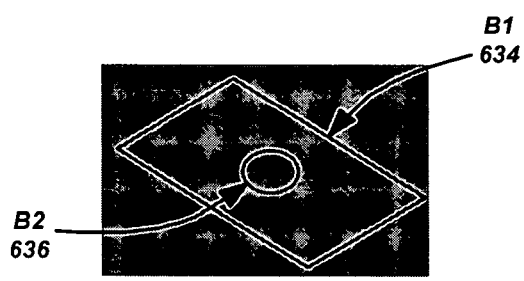
Figure 6F:
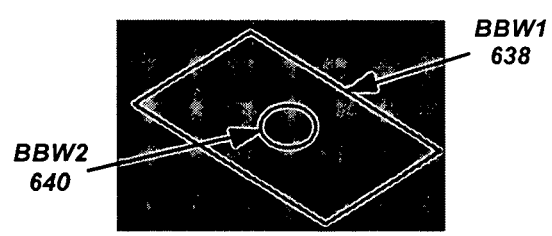

FIG. 6A shows another example of component 400. In FIG. 6B, the present invention extracts FS1 as a body for fillet welds. In addition, the five internal loops are shown in FIG. 6B (500) and FIG. 6C (502, 504, 506, 508). Four edges (600, 602, 604, 606) shown in FIG. 6C are collected in a non-boundary edge list. Four closed loops, created by edges 600, 602, 604, 606 with the edge 608 of the periphery, in FIG. 6C are added to a candidate implicit loop list, as they are not internal loops. The remaining 12 edges (610-632) of the candidate implicit loop list are collected in a boundary edge set (BEset), as shown in FIG. 6D. In this example, the sizes of the boundary edge set (12) and non-boundary edge set (4) are greater than zero; hence, the present invention creates attributes BE (Boundary Edge) for the edges in the BEset. The present invention makes bodies B1 634 and B2 636 from the edges in BEset, as shown in FIG. 6E. Bounding boxes, BBw1 638 and BBw2 640, and edge lengths of the two boundary loops, BL1 and BL2, are found. The outermost loop B1 634 in FIG. 6E has the maximum edge length. It can be seen that BBw2 640 in FIG. 6F is selected as the valid implicit internal loop based on the detection of valid implicit internal loops (as described in FIGS. 12A-B). The attributes BE are used to find the edges on B1, . . . , Bn, and their corresponding edges on FS1 and FS2.

Figure 7A:
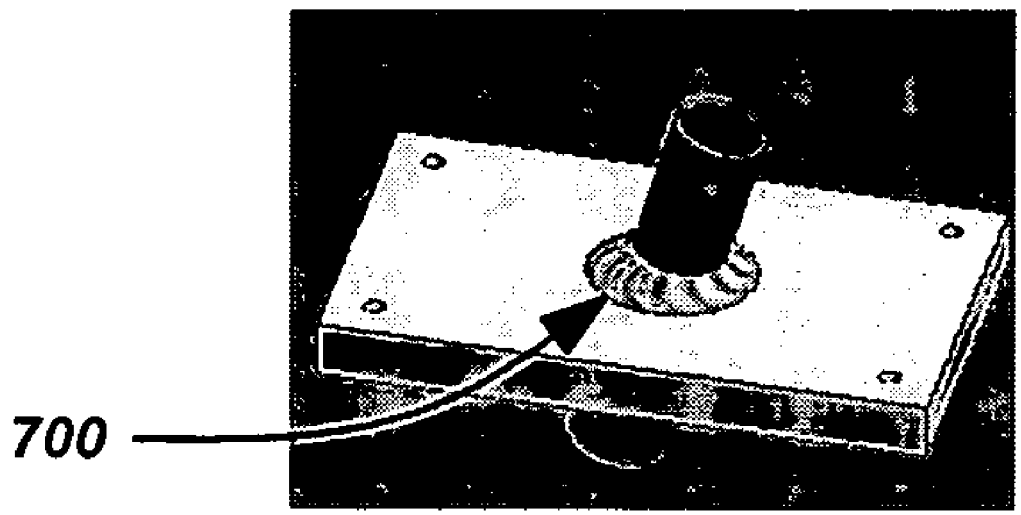
Figure 7B:
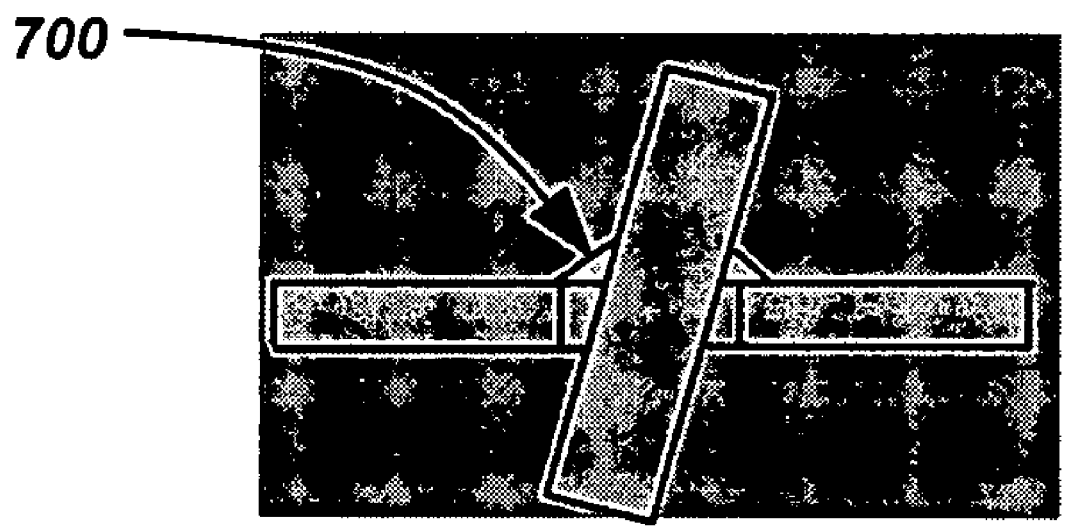

FIG. 7A shows a fillet weld 700 created after filling the gap. FIG. 7B shows a section view of the fillet weld 700 for clarity.

Figure 8A:
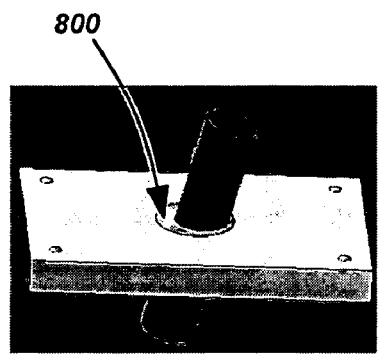
Figure 8B:
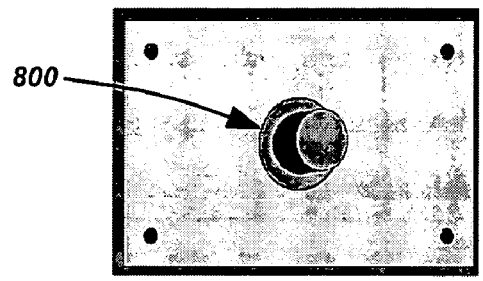
Figure 8C:
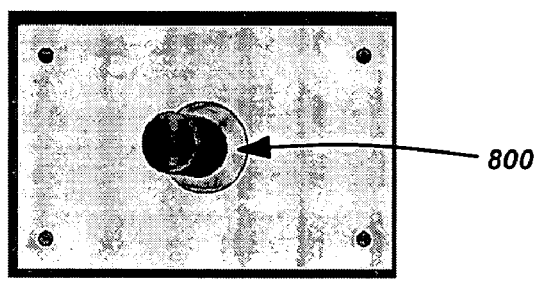
Figure 8D:
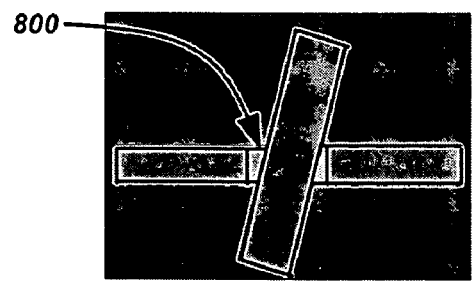

FIG. 8A shows a groove weld 800 created after accounting for the gap between components. Observe the difference in shape in comparison to the fillet weld 700 in FIGS. 7A and 7B. FIGS. 8B and 8C show a top and bottom view of FIG. 8A, while FIG. 8D shows a section view of FIG. 8A for clarity.

Figure 9A:
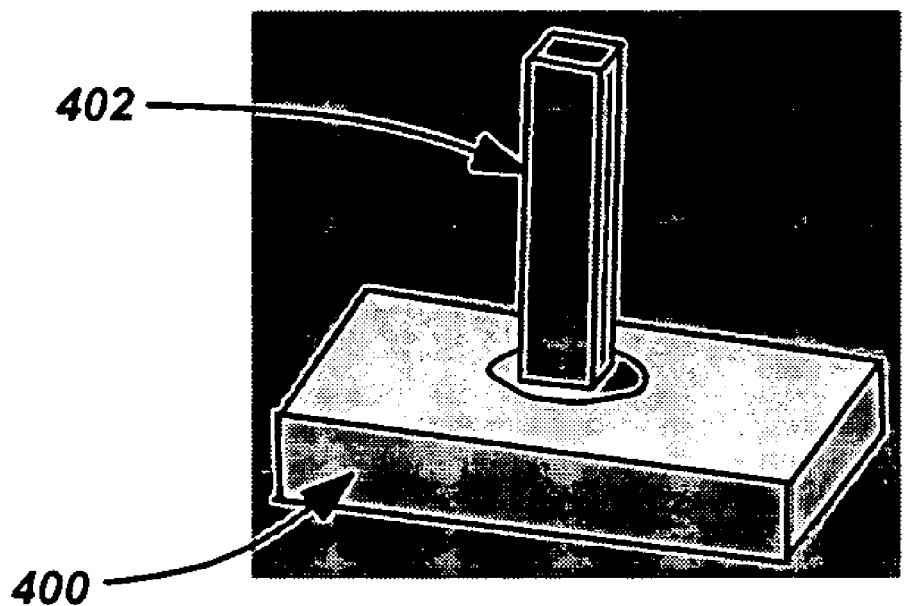
Figure 9B:
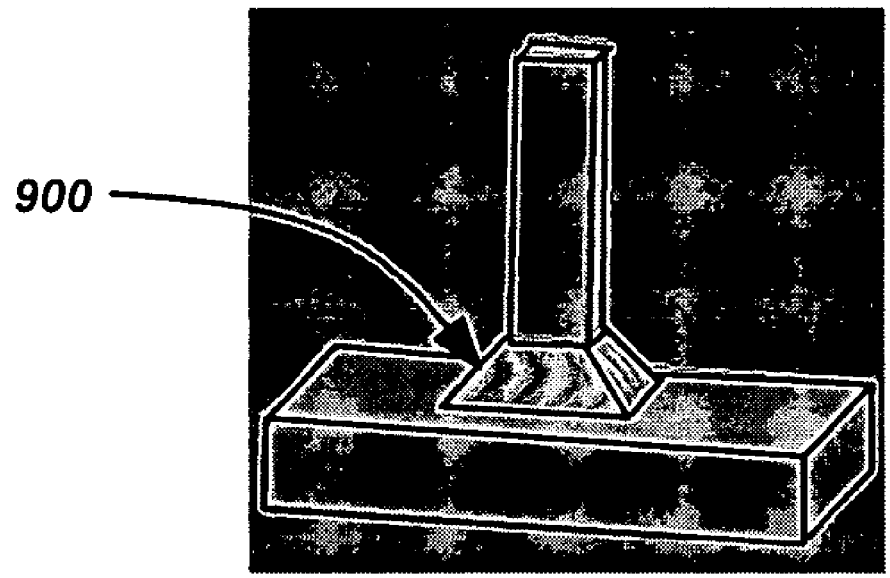

FIG. 9A shows another example where the two components 400, 402 are flush with each other. Even though the component 402 does not pass through the hole in component 400 fully, the present invention is still able to generate a fillet weld 900, as shown in FIG. 9B. A groove weld would fail in this case.

Logic of Preferred Embodiment

FIGS. 10, 11 and 12A-B are flowcharts that illustrate the general logic performed according to the preferred embodiment of the present invention. Those skilled in the art will recognize that this logic is provided for illustrative purposes only and that different logic may be used to accomplish the same results.

Figure 10:
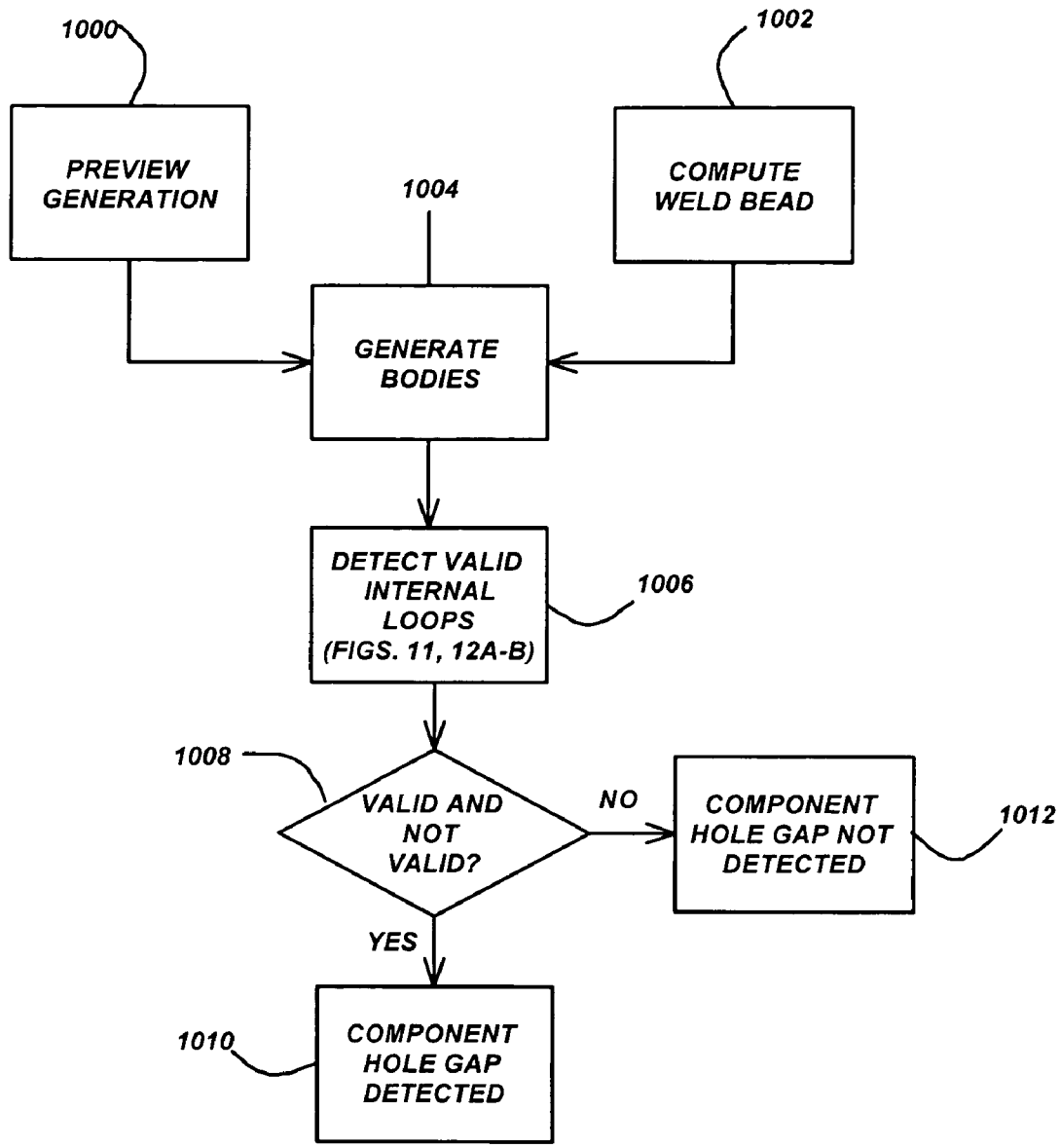
FIGS. 10, 11 and 12A-B are flowcharts that illustrate the general logic performed according to the preferred embodiment of the present invention.

Referring to FIG. 10, this flowchart represents the logic for detecting component hole gaps. The component hole gap is defined as a gap or separation between components, where one or more internal loops of one component fully or partially encircles another component.

The detection of component hole gaps described in FIG. 10 may be invoked from a preview generation function for fillet/gap welds represented by Block 1000, or from a compute function for fillet and groove welds represented by Block 1002.

Block 1004 represents generating bodies B1 and B2 from faces extracted from the components.

Figure 11:
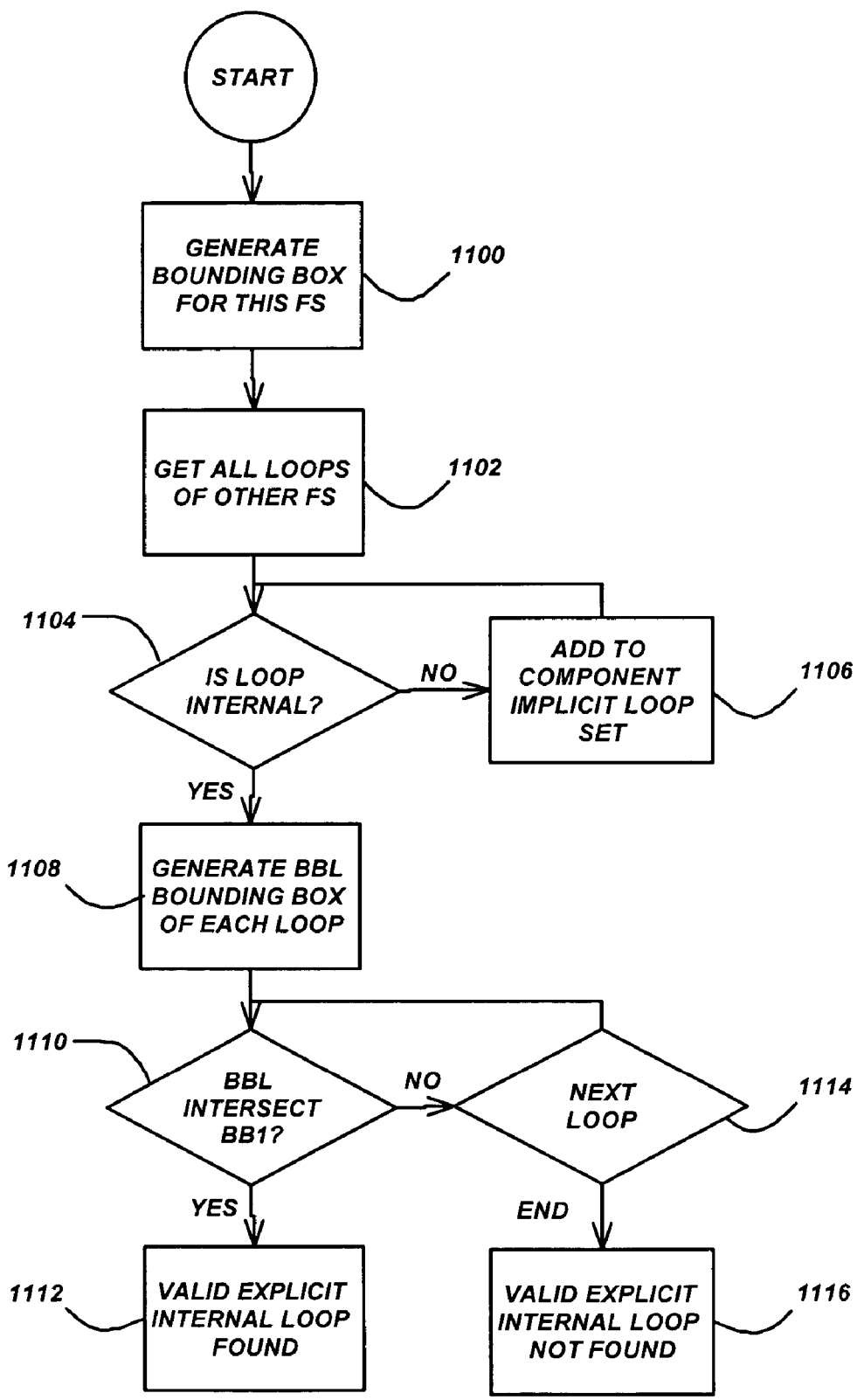

Block 1006 represents detecting valid internal loops in the bodies B1 and B2, which is described in more detail in FIG. 11 (for the detection of valid explicit internal loops) and FIGS. 12A-B (for the detection of valid implicit internal loops) below. Preferably, the logic of FIG. 11 is performed first, followed by the logic of FIGS. 12A-B.

For fillet welds, B1 is generated from FS1 and B2 is generated from FS2. Valid internal loops are then found in B1 and B2.

For groove welds, the faces of FS1 are collected, B1 is generated from FS1, and each adjacent face of FS2 is used to generate body B2, wherein valid internal loops are found in B2. In addition, the faces of FS2 are collected, B2 is generated from FS2, and each adjacent face of FS1 is used to generate body B1, wherein valid internal loops are found in B1.

Block 1008 is a decision block that determines: (1) whether B1 has valid internal loops and B2 does not have valid internal loops, or (2) whether B2 has valid internal loops and B1 does not have valid internal loops. Only one of the bodies can have valid internal loops. The presence of valid internal loops signals the presence of the component hole gap where a suitable weld can be created. If (1) and/or (2) are true, control transfers to Block 1010; otherwise, control transfers to Block 1012.

Block 1010 represents identifying that a component hole gap exists when one of the bodies has valid internal loops and another of the bodies does not have valid internal loops. Thereafter, this block may also represent a weld bead being generated to fill the component hole gap.

Block 1012 represents identifying that a component hole gap does not exist. No weld bead is generated in this case.

As noted above, valid internal loops are classified into two types: (1) explicit and (2) implicit. The detection of valid explicit internal loops is described in FIG. 11 below, while the detection of valid implicit internal loops is described in FIGS. 12A-B below.

Referring to FIG. 11, this flowchart represents the logic for detecting valid explicit internal loops.

The input to this logic comprises the two face-sets FS1 and FS2. For fillet welds, FS1 is "this face-set" and FS2 is the "other face-set," for the purposes of this logic. For groove welds, FS1 is "this face-set" and each adjacent face of FS2 is the "other face-set," for the purposes of this logic.

Block 1100 represents generating a bounding box, BB1, of "this face-set," i.e., the first face-set FS1.

Block 1102 represents all the loops of the "other face-set" being accessed, i.e., the second face-set FS2 for fillet welds and adjacent faces of the second face-set FS2 for groove welds.

Block 1104 is a decision block that determines whether the loops of FS2 are internal loops. An ASM method is used to find out if a loop is internal or not. If not, control transfers to Block 1106; otherwise, control transfers to Block 1108.

Block 1106 represents adding a loop of FS2 to a candidate implicit loop set, if the loop of FS2 is not an internal loop.

Block 1108 represents generating a bounding box, BBL, for each loop of FS2, if the loop is an internal loop.

Block 1110 is a decision block that determines whether BBL intersects BB1 (which was generated in FIG. 10). If so, control transfers to Block 1112; otherwise, control transfers to Block 1114.

Block 1112 represents identifying that a valid explicit internal loop has been found when one of the bounding boxes BBL for the loops of FS2 intersects the bounding box BB1 for FS1.

Block 1114 represents all the internal loops being processed. For each loop, control transfers to Block 1110; upon completion, control transfers to Block 1116.

Block 1116 represents identifying that a valid explicit internal loop has not been found.

Following blocks 1112 and 1116, the logic of FIG. 11 ends.

Figure 12A:
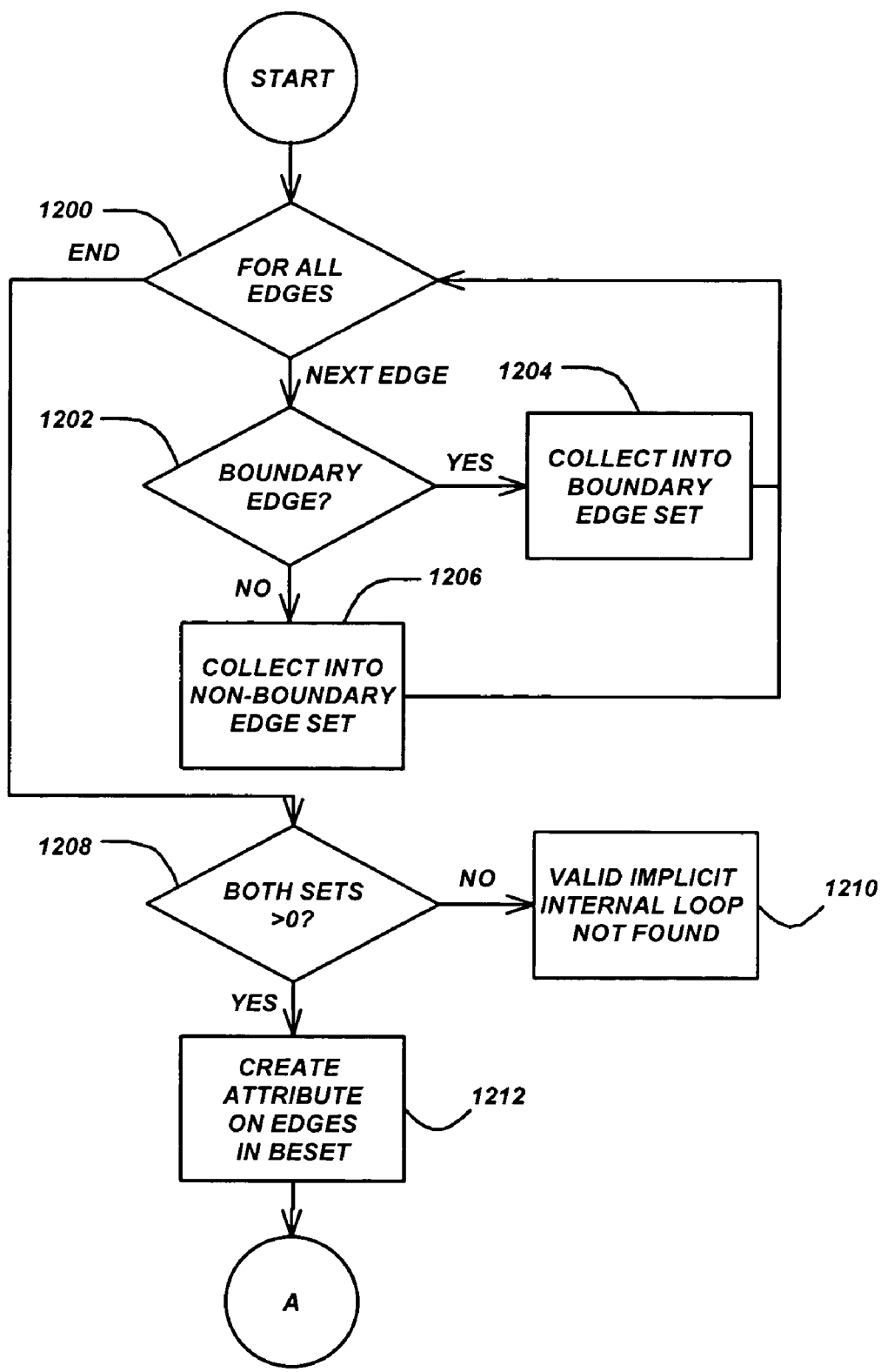
Figure 12B:
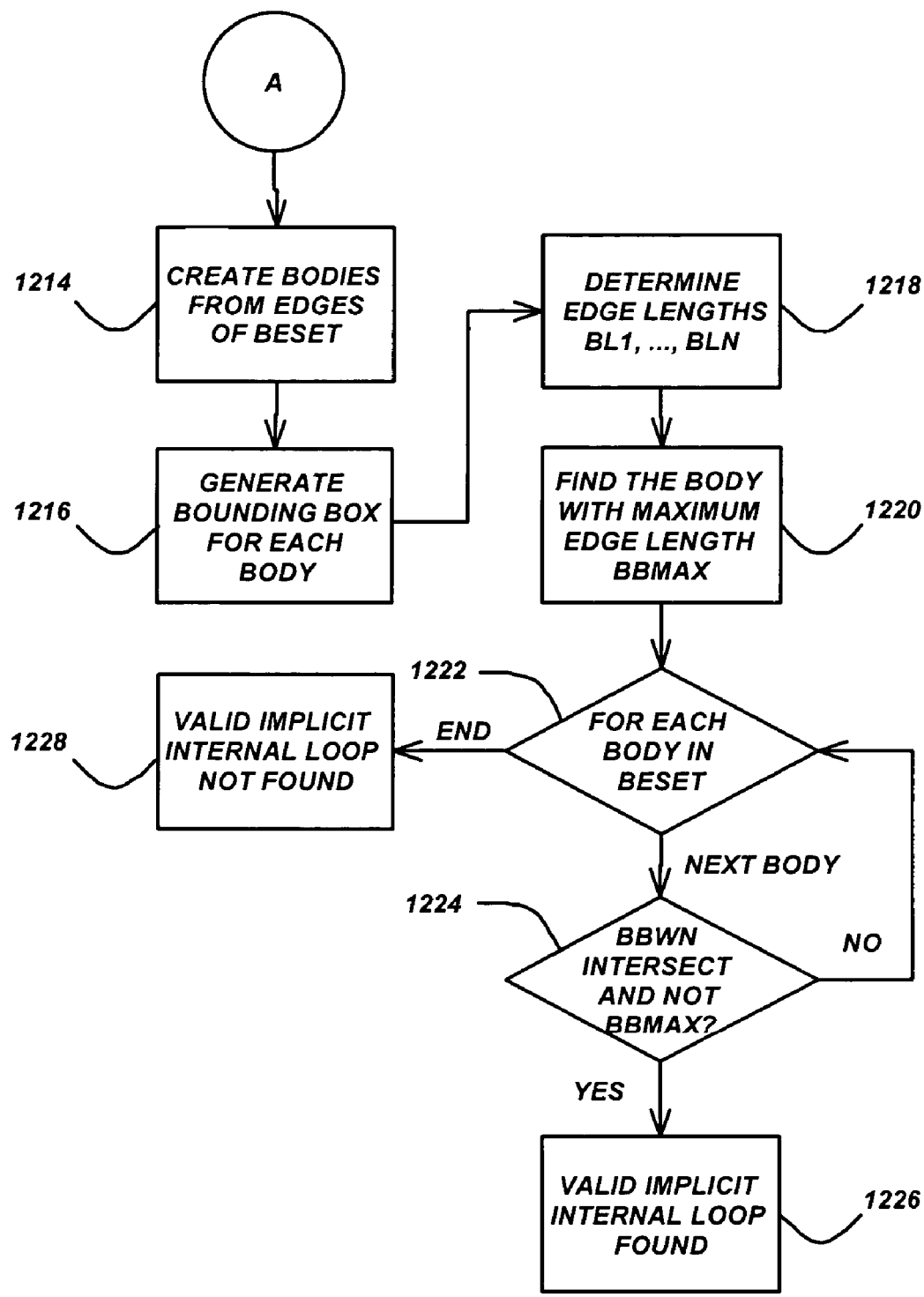

Referring to FIGS. 12A-B, this flowchart represents the logic for detecting valid implicit internal loops.

Block 1200 represents all the edges of all the candidate implicit loops being processed. For each edge, control transfers to Block 1202; upon completion, control transfers to Block 1208.

Block 1202 is a decision block that determines whether the edge of a loop is a boundary edge. If so, control transfers to Block 1204; otherwise, control transfers to Block 1206.

Block 1204 represents collecting edges of all the candidate implicit loops that are boundary edges into a boundary edge set (BEset).

Block 1206 represents collecting edges of all the candidate implicit loops that are not boundary edges into a non-boundary edge set.

Block 1208 is a decision block that determines whether the sizes of both sets are greater than 0, i.e., both sets are not empty. If not, control transfers to Block 1210; otherwise, control transfers to Block 1212.

Block 1210 represents identifying that no valid implicit internal loops have been found, if both sets are not empty.

Block 1212 represents creating attributes BE (Boundary Edge) on edges in the boundary edge set (BEset).

Block 1214 represents creating bodies, B1, . . . , Bn, from the edges of the in the boundary edge set BEset. A Shape Manager 204 method is used to create bodies from the edges.

Block 1216 represents generating bounding boxes, BBw1, . . . , BBwn, for each body created.

Block 1218 represents determining a total edge length, BL1, . . . , BLn, for all the bodies generated. A Shape Manager 204 method is used to determine the individual edge length that is summed up for all the edges to find the total edge length.

Block 1220 represents finding which of the bodies, BBmax, has a largest edge length and is an outermost loop.

Block 1222 represents the processing of each of the bodies in BEset. For each of the bodies, control transfers to Block 1224; upon completion, control transfers to Block 1228.

Block 1224 is a decision block that determines whether BBwn intersects BB1 and Bn is not BBmax. If so, then control transfers to Block 1226; otherwise control returns to Block 1222.

Block 1226 represents identifying that a valid implicit internal loop has been found, when at least one of the boundary boxes BBWn for each body intersects the bounding box BB1 for FS1 and the body is not the body, BBmax, that has the largest edge length.

Block 1228 represents identifying that no valid implicit internal loops have been found.

Following blocks 1226 and 1228, the logic of FIGS. 12A-B ends.

In the cases where the internal loop lies along adjacent planar faces, the present invention can detect 100% of the cases, as the assumption of the maximum edge length is the outermost loop is valid. In certain fringe cases (~2-3%), where the face is of curvy spline geometry, the method will need additional steps for fillet welds only. These are known as non-planar cases, where the faces of FS1 and FS2 for fillet welds have non-planar geometry.

These cases include the following:

The present invention creates bodies B1, B2, which are not equal to the body with the maximum edge length, but which have equal total edge lengths BL1, BL2. For the fillet weld, user interaction is recommended to select the loop along which to close the gap and generate the fillet weld. (If the weld bead type is a groove weld, then the present invention does not need user interaction as the groove weld bead will span both the loops.)

The present invention creates bodies B1, B2 with unequal total edge lengths BL1, BL2. However, the loop that was selected to close the gap results in a weld that is undesirable by the user. In such cases, user interaction is a viable option.

For fillet welds, the valid internal loops are used by the Feature-Based Modeler 206 to fill the gap. After the gap is filled, it becomes a case of two components that touch or intersect, wherein the fillet weld bead is generated using the methods described in the co-pending and commonly-assigned U.S. Utility patent application Ser. No. 10/651,452, filed Aug. 29, 2003, by Somashekar R. Subrahmanyam, entitled "Facial characteristic based generation of fillet weld bead representation," which application was published as U.S. Patent Application Publication 2005/0049742A1, on Mar. 3, 2005, and which application is incorporated by reference herein.

For groove welds, the Feature-Based Modeler 206 uses a different technique (Thicken versus Sweep) to generate the groove weld bead, i.e., thicken in the case of component hole gap, and Sweep or some other suitable method otherwise.

CONCLUSION

This concludes the description of the preferred embodiment of the invention. The following describes some alternative embodiments for accomplishing the present invention. For example, any type of computer could be used with the present invention. In addition, any program, function, or system providing functions for detecting gaps between components or for generating weld beads could benefit from the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for generating weld beads in a computer-implemented solid modeling system, comprising:
    (a) generating, in a computer, a parametric feature-based model of one or more components of an assembly;
    (b) determining, in the computer, whether there is a gap between the components in the model based on internal loops in the components in the model, wherein the gap is a component hole gap between first and second components in the model where one or more of the internal loops of the first component in the model fully or partially encircles the second component in the model;
    (c) generating, in the computer, a parametric feature-based model of a weld bead that fills the gap between the components in the model using the internal loops of the components in the model; and
    (d) storing, in the computer, the parametric feature-based model of the components of the assembly, including the parametric feature-based model of the weld bead, for later use in further analysis or modeling.

2. The method of claim 1, wherein the components are members of a multi-component assembly.

3. The method of claim 1, wherein the weld bead is a fillet weld bead or groove weld bead.

4. The method of claim 1, wherein valid internal loops identify whether the second component passes through the first component through the component hole gap.

5. The method of claim 4, wherein the determining step (b) comprises detecting whether the components include the valid internal loops.

6. The method of claim 5, wherein the determining step (b) comprises:
    generating one or more bodies from faces extracted from the components in the model;
    detecting valid internal loops in the bodies; and
    identifying that the gap exists when one of the bodies has valid internal loops and another of the bodies does not have valid internal loops.

7. The method of claim 6, wherein the valid internal loops comprises valid explicit internal loops, and the detecting the valid internal loops step comprises detecting the valid explicit internal loops.

8. The method of claim 7, wherein the detecting the valid explicit internal loops step comprises:
    generating a bounding box for a first set of faces;
    accessing all the loops of a second set of faces;
    determining whether the loops of second set of faces are internal loops;
    adding a loop of the second set of faces to a candidate implicit loop set, if the loop is not an internal loop;
    generating a bounding box for each loop of the second set of faces, if the loop is an internal loop; and
    identifying that a valid explicit internal loop has been found when one of the bounding boxes for the loops of the second set of faces intersects the bounding box for the first set of faces.

9. The method of claim 6, wherein the valid internal loops comprises valid implicit internal loops, and the detecting the valid internal loops step comprises detecting the valid implicit internal loops.

10. The method of claim 9, wherein the detecting the valid implicit internal loops step comprises:
    collecting edges of all candidate implicit loops that are boundary edges into a boundary edge set;
    collecting edges of all candidate implicit loops that are not boundary edges into a non-boundary edge set;
    identifying that no valid implicit internal loops have been found, if both sets are not empty;
    creating attributes on edges in the boundary edge set;
    creating bodies from the edges in the boundary edge set;
    generating bounding boxes for each body;
    determining a total edge length for all the bodies;
    finding which of the bodies has a largest edge length and is an outermost loop;
    identifying that a valid implicit internal loop has been found when at least one of the boundary boxes for each body intersects the bounding box for the first set of faces and the body is not the body that has the largest edge length.

11. The method of claim 1, wherein the weld bead is a fillet weld bead, and the generating step (c) comprises filling the gap between the components in the model and then generating the parametric feature-based model of the fillet weld bead.

12. An apparatus for generating weld beads in a computer-implemented solid modeling system, comprising:
    (a) a computer; and
    (b) logic, performed by the computer, for:
        (1) generating, in the computer, a parametric feature-based model of one or more components of an assembly;
        (2) determining, in the computer, whether there is a gap between the components in the model based on internal loops in the components in the model, wherein the gap is a component hole gap between first and second components in the model where one or more of the internal loops of the first component in the model fully or partially encircles the second component in the model;
        (3) generating, in the computer, a parametric feature-based model of a weld bead that fills the gap between the components in the model using the internal loops of the components in the model; and
        (4) storing, in the computer, the parametric feature-based model of the components of the assembly, including the parametric feature-based model of the weld bead, for later use in further analysis or modeling.

13. The apparatus of claim 12, wherein the components are members of a multi-component assembly.

14. The apparatus of claim 12, wherein the weld bead is a fillet weld bead or groove weld bead.

15. The apparatus of claim 12, wherein valid internal loops identify whether the second component passes through the first component through the component hole gap.

16. The apparatus of claim 15, wherein the logic for determining (2) comprises logic for detecting whether the components include valid internal loops.

17. The apparatus of claim 16, wherein the logic for determining (2) comprises logic for:
generating one or more bodies from faces extracted from the components in the model;
detecting valid internal loops in the bodies; and
identifying that the gap exists when one of the bodies has valid internal loops and another of the bodies does not have valid internal loops.

18. The apparatus of claim 17, wherein the valid internal loops comprises valid explicit internal loops, and the logic for detecting the valid internal loops comprises logic for detecting the valid explicit internal loops.

19. The apparatus of claim 18, wherein the logic for detecting the valid explicit internal loops comprises logic for:
generating a bounding box for a first set of faces;
accessing all the loops of a second set of faces;
determining whether the loops of second set of faces are internal loops;
adding a loop of the second set of faces to a candidate implicit loop set, if the loop is not an internal loop;
generating a bounding box for each loop of the second set of faces, if the loop is an internal loop; and
identifying that a valid explicit internal loop has been found when one of the bounding boxes for the loops of the second set of faces intersects the bounding box for the first set of faces.

20. The apparatus of claim 17, wherein the valid internal loops comprises valid implicit internal loops, and the logic for detecting the valid internal loops comprises logic for detecting the valid implicit internal loops.

21. The apparatus of claim 20, wherein the logic for detecting the valid implicit internal loops comprises logic for:
collecting edges of all candidate implicit loops that are boundary edges into a boundary edge set;
collecting edges of all candidate implicit loops that am not boundary edges into a non-boundary edge set;
identifying that no valid implicit internal loops have been found, if both sets are not empty;
creating attributes on edges in the boundary edge set;
creating bodies from the edges in the boundary edge set;
generating bounding boxes for each body;
determining a total edge length for all the bodies;
finding which of the bodies has a largest edge length and is an outermost loop;
identifying that a valid implicit internal loop has been found when at least one of the boundary boxes for each body intersects the bounding box for the first set of faces and the body is not the body that has the largest edge length.

22. The apparatus of claim 12, wherein the weld bead is a fillet weld bead, and the logic for generating (3) comprises logic for filling the gap between the components in the model and then generating the parametric feature-based model of the fillet weld bead.

23. A method for determining whether there is a gap between components of an assembly represented by a model in a computer-implemented solid modeling system, comprising:
detecting, in the computer, whether the components in the model include valid internal loops;
determining, in the computer, whether the gap exists between the components in the model based on the valid internal loops of the components in the model, wherein the gap is a component hole gap between first and second components in the model where one or more of the valid internal loops of the first component in the model fully or partially encircles the second component in the model;
updating, in the computer, the model to fill the gap between the components in the model using the valid internal loops of the components in the model; and
storing, in the computer, the updated model for later use in further analysis or modeling.

24. The method of claim 23, wherein the valid internal loops comprise valid explicit internal loops or valid implicit internal loops.

25. An apparatus for determining whether there is a gap between components of an assembly represented by a model in a computer-implemented solid modeling system, comprising:
(a) a computer; and
(b) logic, performed by the computer, for:
(1) detecting whether the components in the model include valid internal loops;
(2) determining whether the gap exists between the components in the model based on the valid internal loops of the components in the model, wherein the gap is a component hole gap between first and second components in the model where one or more of the valid internal loops of the first component in the model fully or partially encircles the second component in the model;
(3) updating, in the computer, the model to fill the gap between the components in the model using the valid internal loops of the components in the model; and
(4) storing, in the computer, the updated model for later use in further analysis or modeling.

26. The apparatus of claim 25, wherein the valid internal loops comprise valid explicit internal loops or valid implicit internal loops.

* * * * *

UNITED STATES PATENT AND TRADEMARK OFFICE
CERTIFICATE OF CORRECTION

| | |
|---|---|
| PATENT NO. | : 7,539,603 B2 |
| APPLICATION NO. | : 11/215424 |
| DATED | : May 26, 2009 |
| INVENTOR(S) | : Subrahmanyam |

It is certified that error appears in the above-identified patent and that said Letters Patent is hereby corrected as shown below:

Column 11

Claim 21, line 38, please delete "am" and insert --are--.

Signed and Sealed this

Ninth Day of November, 2010

David J. Kappos
*Director of the United States Patent and Trademark Office*